United States Patent
Nakayama et al.

(10) Patent No.: US 9,178,134 B2
(45) Date of Patent: Nov. 3, 2015

(54) MAGNETORESISTIVE ELEMENT AND METHOD OF MANUFACTURING THE SAME

(71) Applicants: Masahiko Nakayama, Seoul (KR); Tadashi Kai, Seoul (KR); Masaru Toko, Seoul (KR); Toshihiko Nagase, Seoul (KR); Hiroaki Yoda, Seoul (KR)

(72) Inventors: Masahiko Nakayama, Seoul (KR); Tadashi Kai, Seoul (KR); Masaru Toko, Seoul (KR); Toshihiko Nagase, Seoul (KR); Hiroaki Yoda, Seoul (KR)

(*) Notice: Subject to any disclaimer, the term of this patent is extended or adjusted under 35 U.S.C. 154(b) by 0 days.

(21) Appl. No.: 14/203,198

(22) Filed: Mar. 10, 2014

(65) Prior Publication Data

US 2015/0061053 A1    Mar. 5, 2015

Related U.S. Application Data

(60) Provisional application No. 61/872,281, filed on Aug. 30, 2013.

(51) Int. Cl.
| | | |
|---|---|---|
| H01L 29/00 | (2006.01) | |
| H01L 43/10 | (2006.01) | |
| H01L 43/12 | (2006.01) | |
| H01L 45/00 | (2006.01) | |
| H01L 29/82 | (2006.01) | |
| H01L 27/24 | (2006.01) | |
| H01L 27/22 | (2006.01) | |

(52) U.S. Cl.
CPC .............. *H01L 43/10* (2013.01); *H01L 27/222* (2013.01); *H01L 27/2463* (2013.01); *H01L 29/82* (2013.01); *H01L 43/12* (2013.01); *H01L 45/06* (2013.01)

(58) Field of Classification Search
CPC ... H01L 27/222; H01L 45/06; H01L 27/2463; H01L 29/82
See application file for complete search history.

(56) References Cited

U.S. PATENT DOCUMENTS

| | | |
|---|---|---|
| 8,043,732 B2 | 10/2011 | Anderson et al. |
| 8,445,979 B2 | 5/2013 | Oh et al. |
| 2006/0132986 A1 | 6/2006 | Hwang et al. |
| 2008/0237693 A1 | 10/2008 | Lee et al. |
| 2011/0260272 A1 | 10/2011 | Lee et al. |
| 2012/0061783 A1 | 3/2012 | Anderson et al. |
| 2013/0234269 A1 | 9/2013 | Oh et al. |
| 2013/0285178 A1 | 10/2013 | Lee et al. |
| 2013/0307102 A1 | 11/2013 | Oh et al. |
| 2015/0001654 A1* | 1/2015 | Sandhu et al. ............ 257/421 |
| 2015/0028439 A1* | 1/2015 | Kula et al. .................. 257/421 |

FOREIGN PATENT DOCUMENTS

JP    3946355 B2    7/2007

* cited by examiner

*Primary Examiner* — Ngan Ngo
(74) *Attorney, Agent, or Firm* — Holtz, Holtz, Goodman & Chick PC

(57) ABSTRACT

According to one embodiment, a magnetoresistive element is disclosed. The element includes a first magnetic film, a second magnetic film, and a first nonmagnetic layer formed between the first magnetic film and the second magnetic film. The second magnetic film includes a first magnetic layer formed on a side of the first nonmagnetic layer, a second magnetic layer formed on a side opposite to the first nonmagnetic layer, and a second nonmagnetic layer formed between the first magnetic layer and the second magnetic layer and containing TiN.

12 Claims, 8 Drawing Sheets

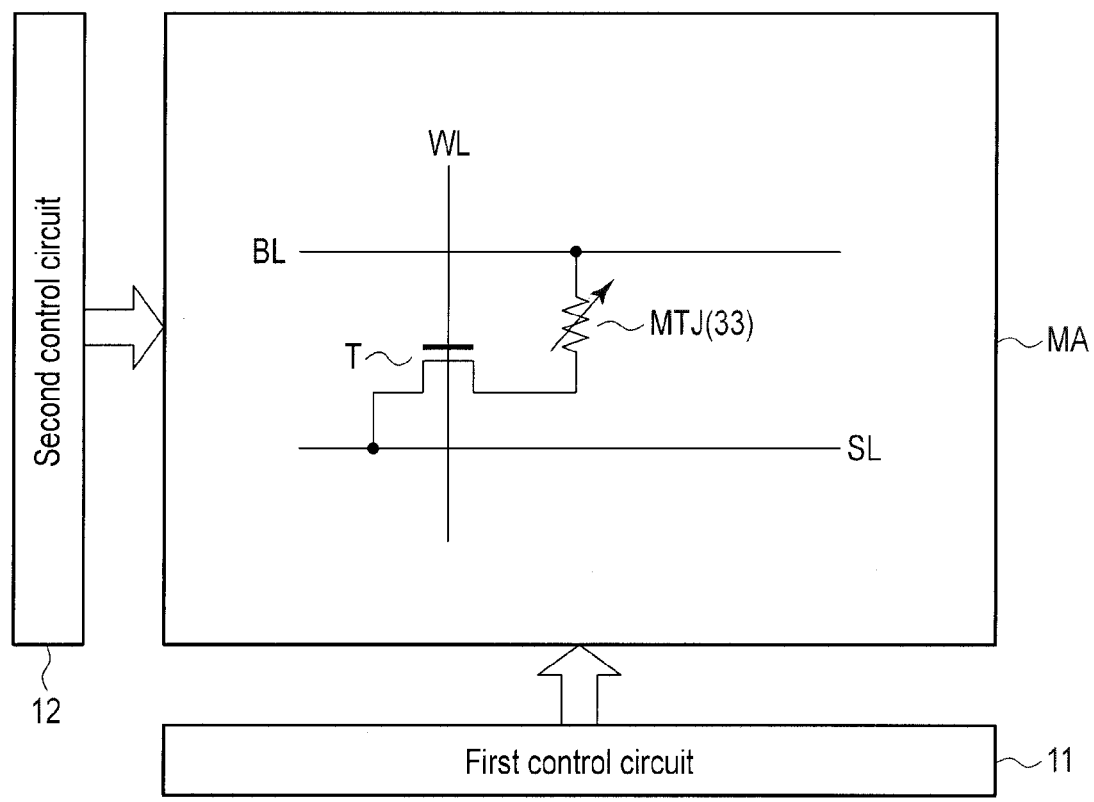
F I G. 1

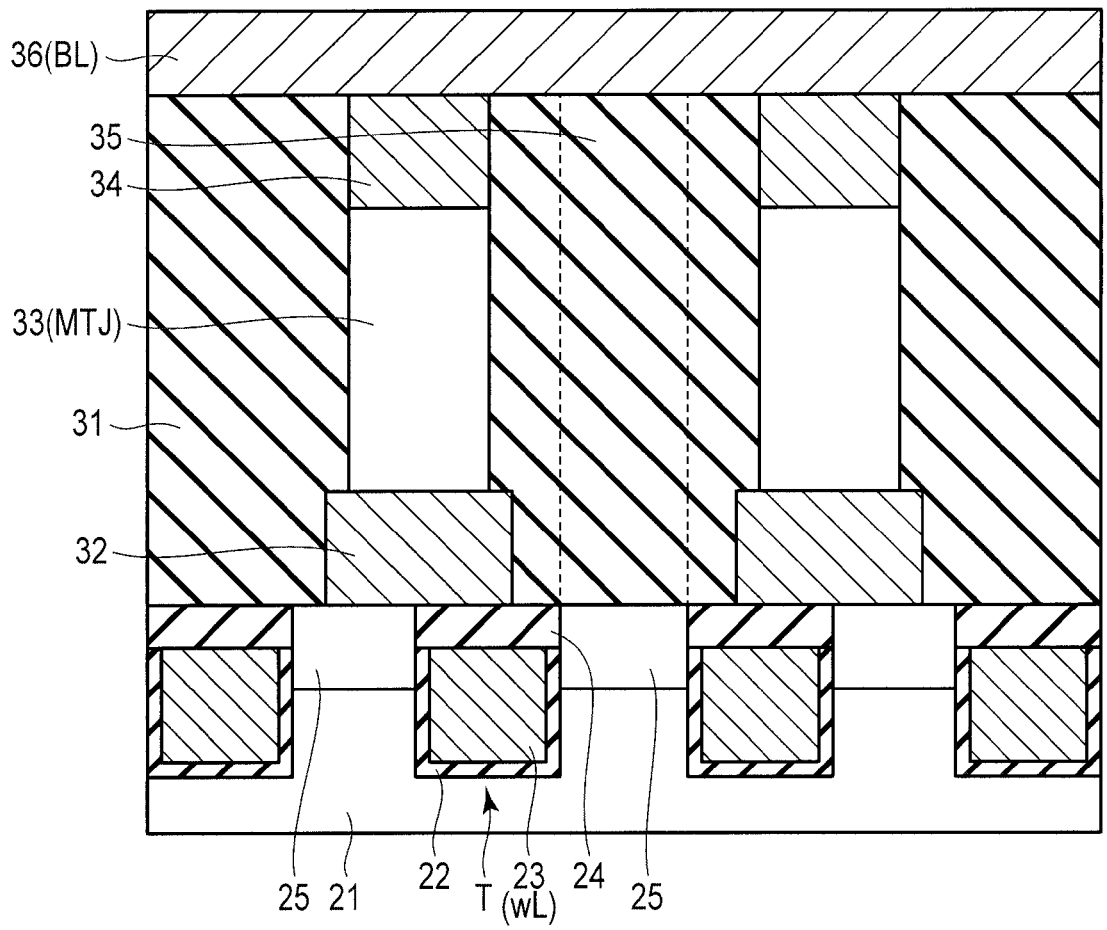
F I G. 3

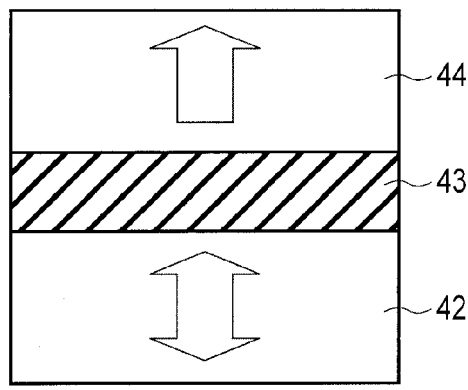
FIG. 4A
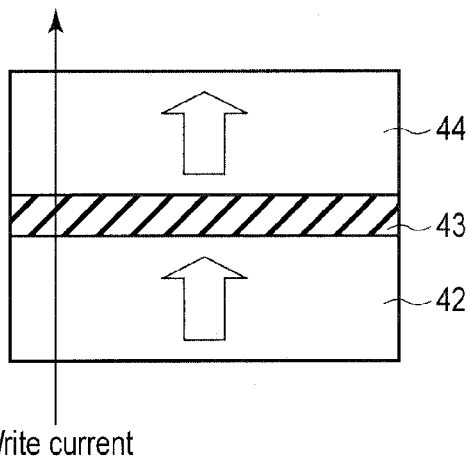
FIG. 4B  Parallel state (low resistance)
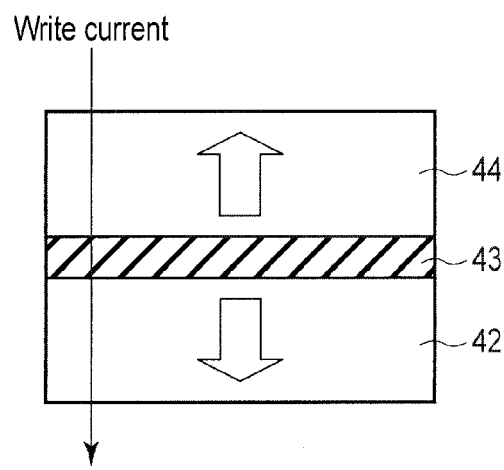
FIG. 4C  Antiparallel state (high resistance)

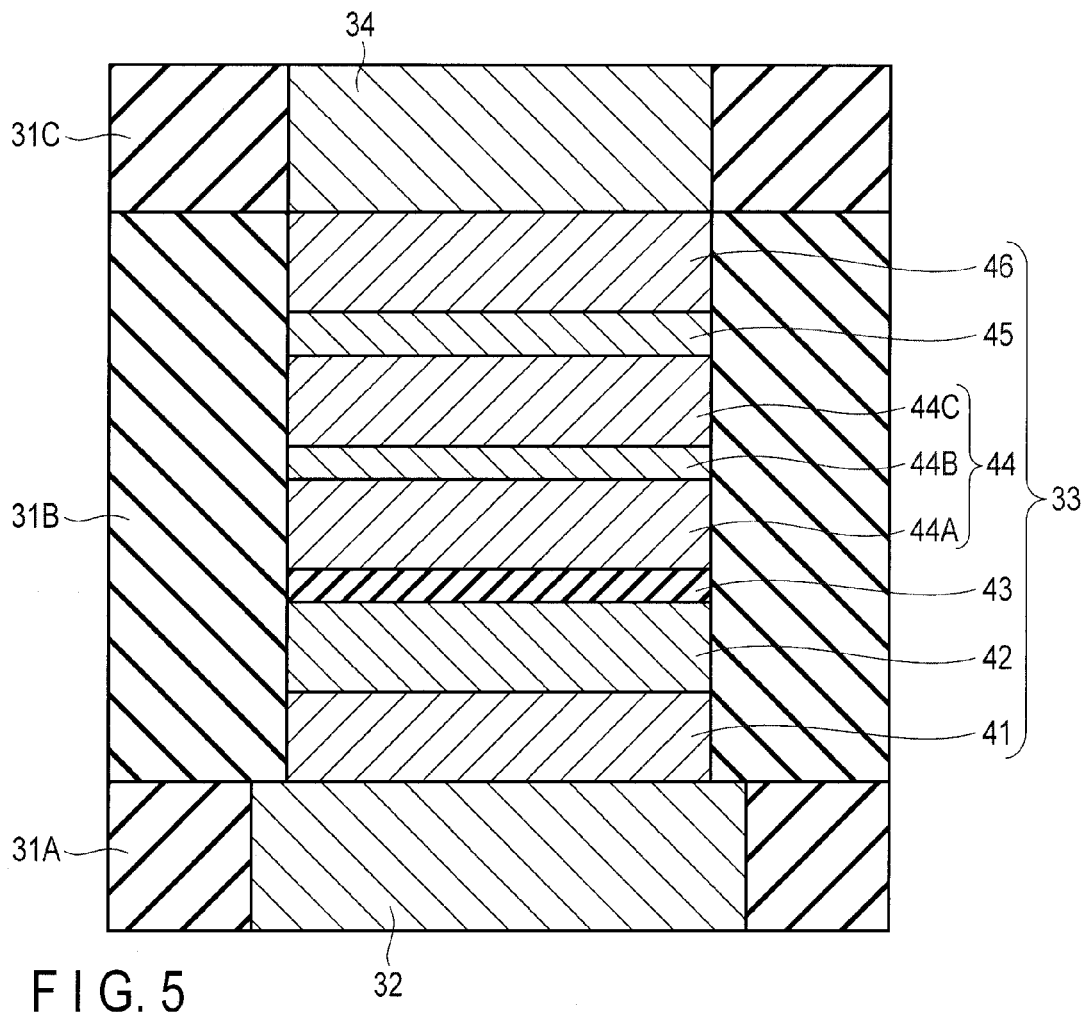
F I G. 5
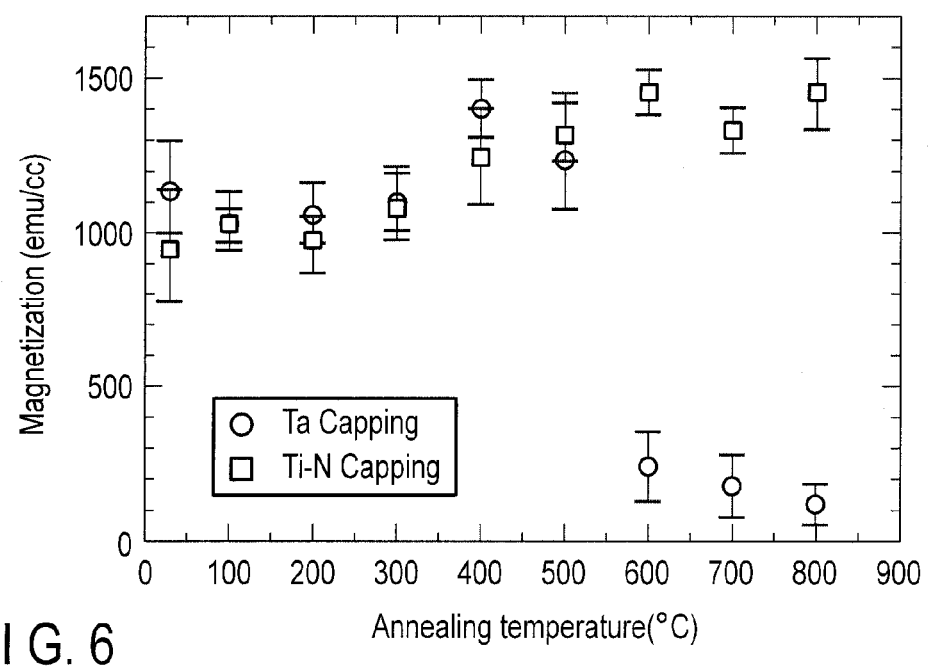
F I G. 6

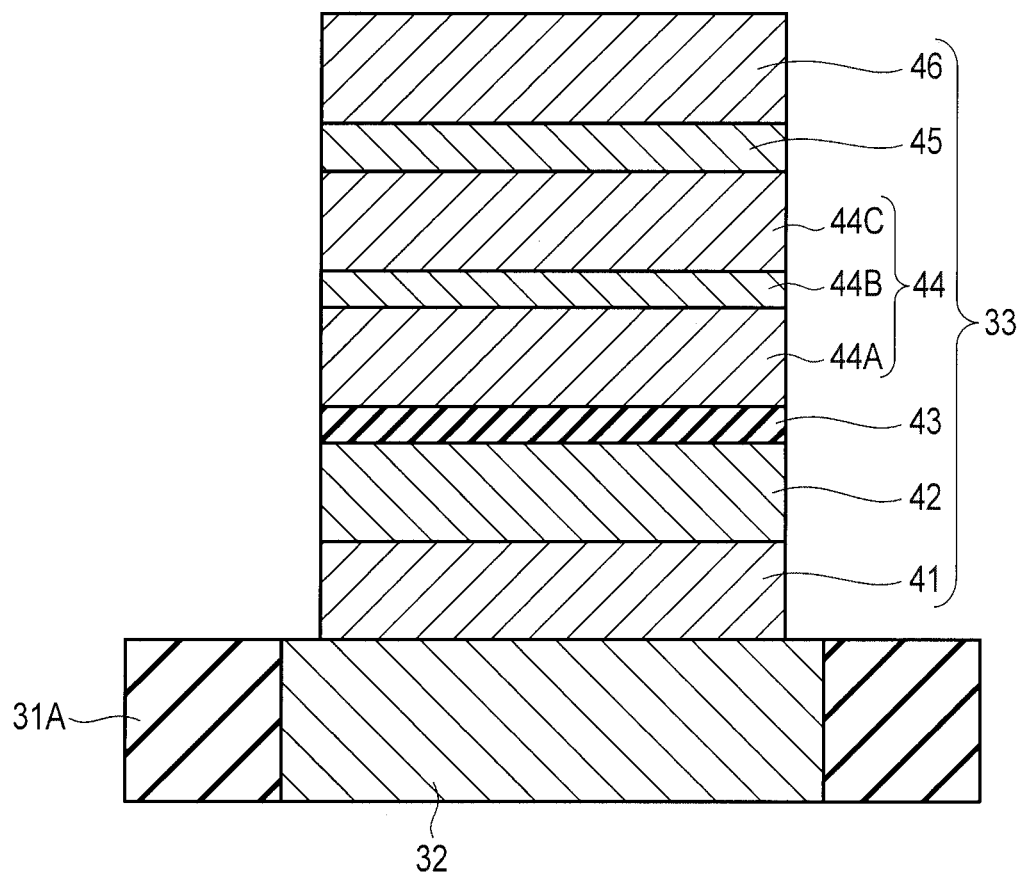
F I G. 9

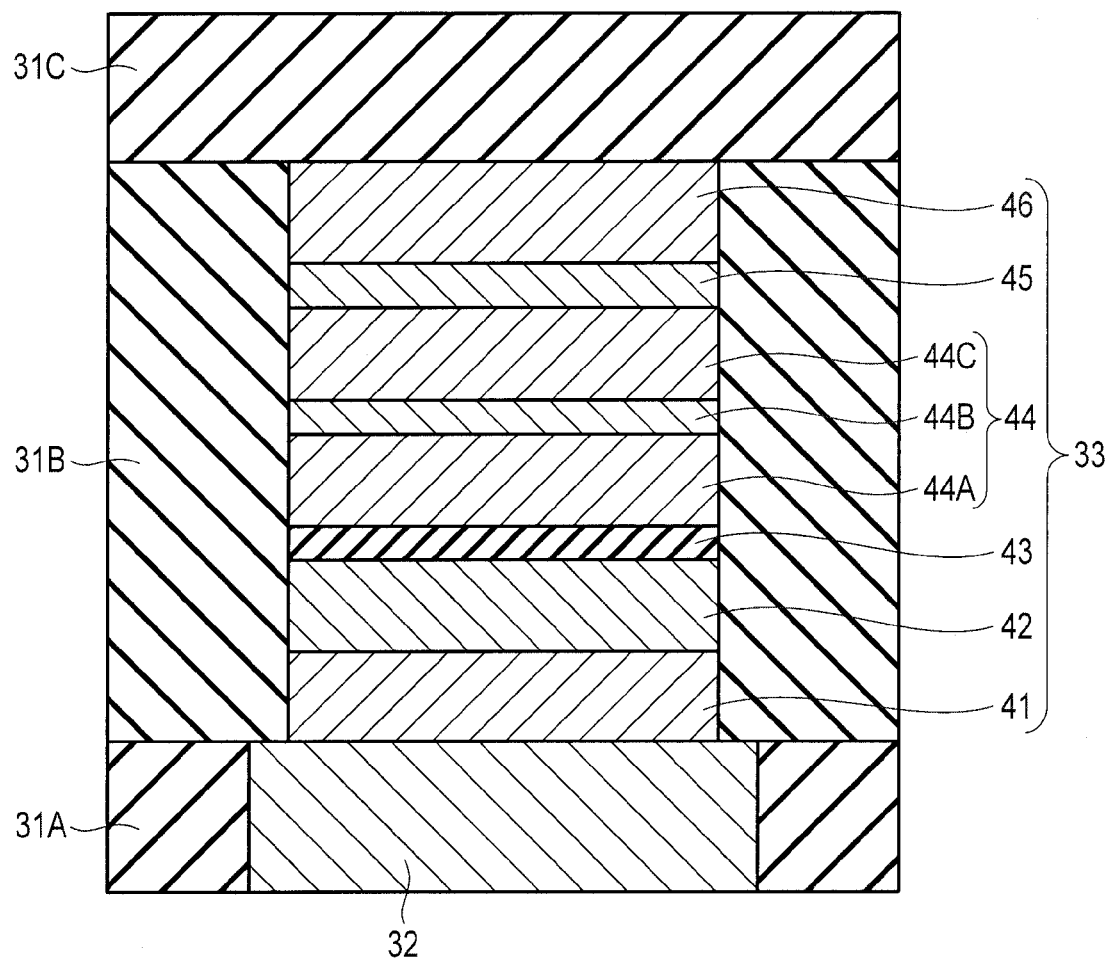
F I G. 10

US 9,178,134 B2

MAGNETORESISTIVE ELEMENT AND METHOD OF MANUFACTURING THE SAME

CROSS-REFERENCE TO RELATED APPLICATIONS

This application claims the benefit of U.S. Provisional Application No. 61/872,281, filed Aug. 30, 2013, the entire contents of which are incorporated herein by reference.

FIELD

Embodiments described herein relate generally to a magnetoresistive element and a method of manufacturing the same.

BACKGROUND

A spin transfer torque MRAM (Magnetic Random Access Memory) including a magnetoresistive element containing a ferromagnetic material as a memory element has been proposed. This MRAM is a memory that stores information by controlling the electrical resistance of the magnetoresistive element in two states of a high-resistance state/low-resistance state by changing a magnetization direction in a magnetic layer by electric current to be injected into the magnetoresistive element.

The magnetoresistive element includes a storage layer which is a ferromagnetic layer having a variable magnetization direction, a reference layer which is a ferromagnetic layer having an invariable magnetization direction, and a tunnel barrier layer which is a nonmagnetic layer formed between them.

BRIEF DESCRIPTION OF THE DRAWINGS

FIG. 1 is a circuit diagram showing a memory cell array of an MRAM according to an embodiment;

FIG. 3 is a sectional view taken along a line A-A' in FIG. 2;

FIG. 4A is a sectional view showing an outline configuration of a magnetoresistive element;

FIG. 4B is a view for explaining a write operation of the magnetoresistive element, and show a sectional view of the magnetoresistive element in a parallel state;

FIG. 4C is a view for explaining the write operation of the magnetoresistive element, and shows a sectional view of the magnetoresistive element in an antiparallel state;

FIG. 5 is a sectional view showing an example of arrangement of the magnetoresistive element according to the embodiment;

FIG. 6 is a graph showing a relationship between annealing temperature and magnetization in a reference layer; and FIGS. 7, 8, 9, and 10 are sectional views showing the manufacturing steps of the magnetoresistive element according to the embodiment.

DETAILED DESCRIPTION

Figure 2:
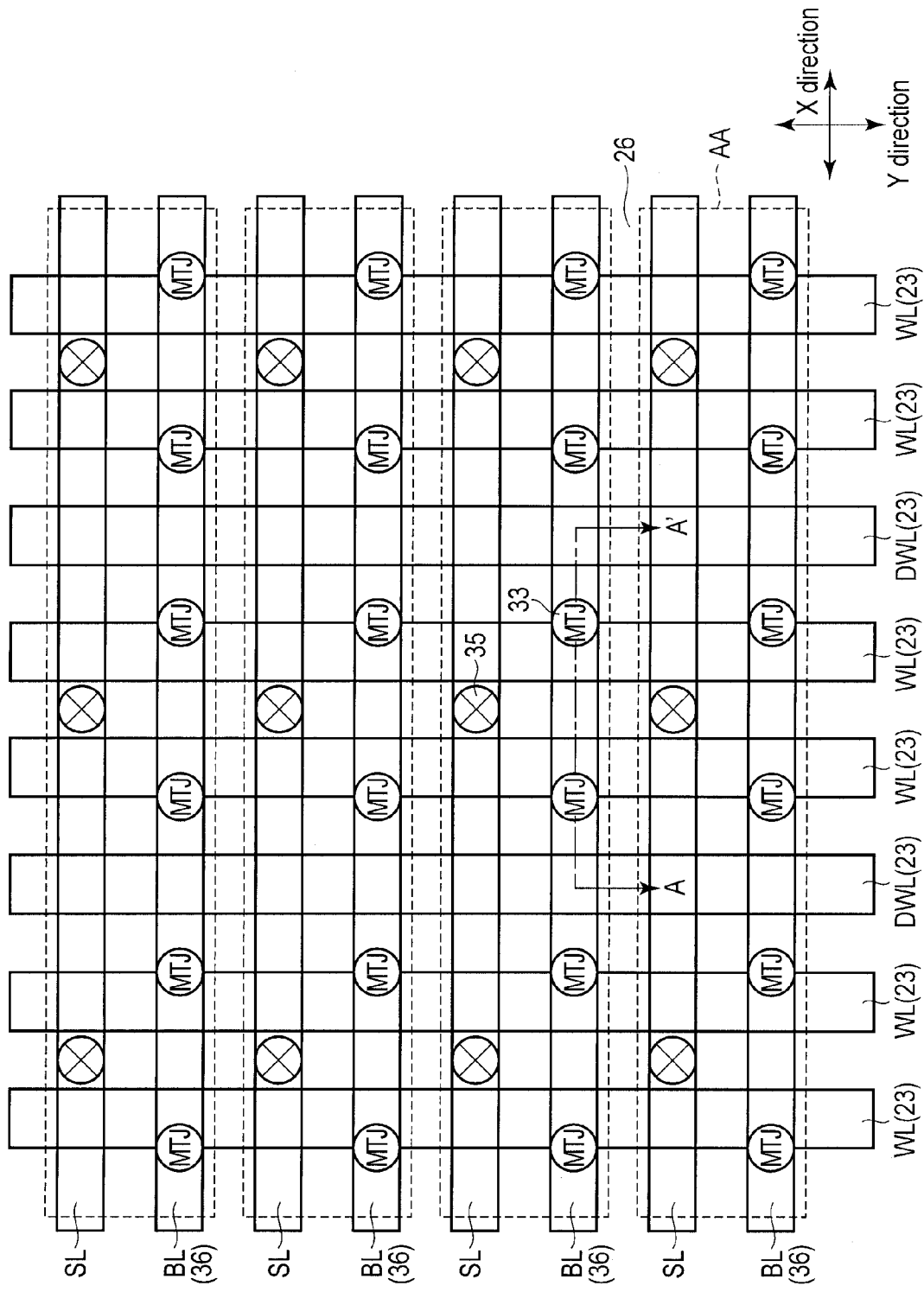
FIG. 2 is a plan view showing the memory cell array of the MRAM according to the embodiment.

In general, according to one embodiment, a magnetoresistive element is disclosed. The element includes a first magnetic film, a second magnetic film, and a first nonmagnetic layer formed between the first and second magnetic films. The second magnetic film includes a first magnetic layer formed on the side of the first nonmagnetic layer, a second magnetic layer formed on the side opposite to the first nonmagnetic layer, and a second nonmagnetic layer formed between the first and second magnetic layers and containing TiN.

A reference layer in a magnetoresistive element includes a first magnetic layer (e.g., Co, Fe, and B) that contributes to the MR ratio (Magnetic Resistance ratio), a second magnetic layer (e.g., Co and Pt) that contributes to the perpendicular magnetic anisotropy, and a second nonmagnetic layer (e.g., Ta, W, or Hf) formed between them. To increase the MR ratio, it is necessary to obtain a high magnetic anisotropy and high crystallinity by annealing the reference layer at a high temperature.

However, annealing the reference layer at the high temperature causes nonmagnetic material (e.g., Ta, W, or Hf) contained in the spacer layer and nonmagnetic material (e.g., Pt) contained in the second magnetic layer to diffuse into the first magnetic layer. Thereby, the crystallinity of the first magnetic layer is destroyed. Consequently, on the contrary, the high temperature annealing decreases the MR ratio.

By contrast, the present embodiment solves the above problem by using TiN as the spacer layer.

The present embodiment will be explained below with reference to the accompanying drawings. In these drawings, the same reference numerals denote the same parts. Also, a repetitive explanation will be made as needed.

Embodiment

An MRAM according to the present embodiment will be explained below with reference to FIG. 1 to FIG. 10. The MRAM according to the present embodiment comprises a reference layer 44 in a magnetoresistive element (MTJ element) 33 includes a first magnetic layer 44A containing CoFeB, a second magnetic layer 44C containing Co and Pt, and a nonmagnetic layer 44B formed between them. And the nonmagnetic layer 44B contains TiN. Thereby, the diffusion of nonmagnetic material (e.g., Pt or Ti) contained in the nonmagnetic layer 44B or the second magnetic layer 44C into the first magnetic layer 23 by high temperature annealing can be suppressed. The present embodiment will be explained in detail below.

MRAM Basic Configuration Example

A basic configuration example of the MRAM according to the present embodiment will be explained with reference to FIG. 1 to FIG. 4.

FIG. 1 is a circuit diagram showing a memory cell array of the MRAM according to the present embodiment.

As shown in FIG. 1, a memory cell in the memory cell array MA comprises a series circuit of the magnetoresistive element 33 and a switching element (e.g., an FET) T. One end of the series circuit (one end of the magnetoresistive element 33) is electrically connected to a bit line BL, and the other end of the series circuit (one end of the switching element T) is electrically connected to a source line SL. The control terminal of the switching element T, e.g., the gate electrode of the FET is electrically connected to a word line WL.

Electric potential of the word line WL is controlled by a first control circuit 11. Also, Electric potentials of the bit line BL and source line SL are controlled by a second control circuit 12.

FIG. 2 is a plan view showing the memory cell array of the MRAM according to the present embodiment. FIG. 3 is a sectional view taken along a line A-A' in FIG. 2. FIG. 3 shows a section of a source line contact 35, in addition to the section of the magnetoresistive element 33.

As shown in FIGS. 2 and 3, in the memory cell array MA, as an example, a plurality of word lines WL and a plurality of dummy word lines DWL running in the Y direction, and a plurality bit lines BL and a plurality of source lines SL running in the X direction perpendicular to the Y direction are arranged. Two word lines WL and one dummy word line DWL are alternately arranged along the X direction. Also, the bit line BL and source line SL are alternately arranged along the Y direction.

In addition, in the memory cell array MA, an element isolation insulating layer extending in the X direction is provided in a surface region of a p type semiconductor substrate (e.g., a silicon substrate) 21, and this region functions as an element isolation region 26. In the surface region of the semiconductor substrate 21, a region on which no element isolation insulating layer is provided functions as an active area AA. That is, the element isolation region 26 and active area AA are alternately formed along the Y direction. The element isolation insulating layer comprises, for example, an STI (Shallow Trench Isolation). As the element isolation insulating layer, an insulating material having a high filling characteristic such as silicon nitride (SiN) is used.

As shown in FIG. 3, a selection transistor using, e.g., an n-channel MOSFET (Metal Oxide Semiconductor Field Effect Transistor) is provided as the switching element T in the semiconductor substrate 21. The selection transistor has a structure where a recess is formed in the semiconductor substrate 21, this recess is fill with a gate electrode 23 containing, for example, polycrystalline silicon.

More specifically, the selection transistor T comprises a gate insulating layer 22, the gate electrode 23, and two diffusion layers 25 (a drain side diffusion layer and source side diffusion layer).

The gate insulating layer 22 is formed on the inner surface of the lower portion of the recess formed in the surface of the semiconductor substrate 21 and extending in the Y direction. The gate electrode 23 is formed on the inner surface of the gate insulating layer 22 so as to fill the lower portion of the recess. This gate electrode 23 corresponds to the word line WL. An insulating layer 24 made of, e.g., SiN is formed on those upper surfaces of the gate insulating layer 22 and gate electrode 23 so as to fill the upper portion of the recess. The upper surface of the insulating layer 24 is approximately as high as the upper surface of the semiconductor substrate 21 (the upper surfaces of the diffusion layers 25 to be described later).

The two diffusion layers 25 are formed in the surface of the semiconductor substrate 21 so as to sandwich the gate insulating layer 22, gate electrode 23, and insulating layer 24. The diffusion layer 25 positioned between two memory cells adjacent to each other along the X direction are shared by the two adjacent memory cells. On the other hand, the diffusion layers 25 are isolated by the element isolation region 26 along the Y direction. In other words, the diffusion layers 25 of two memory cells adjacent to each other along the Y direction are adjacent to each other via the element isolation region. That is, the diffusion layers 25 are positioned in the active area AA except for the formation regions of the gate insulating layer 22, gate electrode 23, and insulating layer 24. An interlayer dielectric layer 31 is formed on the semiconductor substrate 21 (on the insulating layer 24 and diffusion layers 25).

On one diffusion layer 25 (the drain side diffusion layer) in the interlayer dielectric layer 31, a lower electrode 32, the magnetoresistive element 33, and an upper electrode 34 are formed in this order.

More specifically, the lower electrode 32 is formed in contact with a portion of the upper surface of one diffusion layer 25 (the drain side diffusion layer), and a portion of the upper surface of the insulating layer 24. In other words, the lower electrode 32 and diffusion layer 25 partially overlap each other in a plane. This is so because the processing methods of the lower electrode 32 and the diffusion layer 25 (the recess) are different. The planar shape of the interlayer dielectric layer 31 is, for example, a square. The lower electrode 32 contains, for example, TiN, but not limited to this.

The magnetoresistive element 33 is formed in contact with the upper surface of the lower electrode 32. The magnetoresistive element 33 has, for example, a circular planar shape, and is formed into a pillar shape. In other words, the magnetoresistive element 33 and lower electrode 32 overlap each other in a plane. Also, the planar area of the magnetoresistive element 33 is desirably smaller than that of the lower electrode 32. This makes it possible to bring the entire lower surface of the magnetoresistive element 33 into contact with the upper surface of the lower electrode 32, and reduce the contact resistance between them.

FIG. 4A is a sectional view showing an outline configuration of the magnetoresistive element. Here, a storage layer 42, a tunnel barrier layer 43, and the reference layer 44 are mainly shown as the magnetoresistive element 33.

As shown in FIG. 4A, the magnetoresistive element 33 includes a stacked body comprising the storage layer 42 which is a ferromagnetic (to be also simply referred to as magnetic in some cases) layer (magnetization film), the reference layer 44 which is a ferromagnetic layer, and the tunnel barrier layer 43 which is a nonmagnetic layer formed between them.

The storage layer 42 is a ferromagnetic layer in which the magnetization direction is variable, and has perpendicular magnetic anisotropy perpendicular or almost perpendicular to the film surfaces (upper surface/lower surface). Here, "the magnetization direction is variable" means that the magnetization direction changes with respect to a predetermined write current. Also, "almost perpendicular" means that the direction of the residual magnetization falls within the range of $45° < \theta \leq 90°$ with respect to the film surfaces.

The tunnel barrier layer 43 is formed on the storage layer 42. The tunnel barrier layer 43 is a nonmagnetic layer, and made of, for example, MgO.

The reference layer 44 is formed on the tunnel barrier layer 43. The reference layer 44 is a ferromagnetic layer in which the magnetization direction is invariable, and has perpendicular magnetic anisotropy perpendicular or almost perpendicular to the film surfaces. Here, "the magnetization direction is invariable" means that the magnetization direction does not change with respect to a predetermined write current. That is, the reference layer 44 has a magnetization direction switching energy barrier larger than that of the storage layer 42.

FIG. 4B is a view for explaining a write operation of the magnetoresistive element, and shows a sectional view of the magnetoresistive element in a parallel state. FIG. 4C is a view for explaining a write operation of the magnetoresistive element, and shows sectional view of the magnetoresistive element in an antiparallel state.

The magnetoresistive element 33 is, for example, a spin transfer torque magnetoresistive element. Therefore, when writing data in the magnetoresistive element 33 or reading data from the magnetoresistive element 33, electric current is bidirectionally supplied to the magnetoresistive element 33 in a direction perpendicular to the film surfaces.

More specifically, data is written in the magnetoresistive element 33 as follows.

As shown in FIG. 4B, when the electric current flows from the lower electrode 32 to the upper electrode 34, i.e., when electrons are supplied from the upper electrode 34 (when electrons move from the reference layer 44 to the storage layer 42), electrons which are spin polarized in the same direction as the magnetization direction in the reference layer 44 are injected into the storage layer 42. In this case, the magnetization direction of the storage layer 42 is matched with the magnetization direction in the reference layer 44. Thereby, the magnetization directions in the reference layer 44 and storage layer 42 are arranged parallel to each other. In this parallel state, the resistance value of the magnetoresistive element 33 is minimum. This state is defined as, for example, data "0".

On the other hand, as shown in FIG. 4C, when electric current flows from the upper electrode 34 to the lower electrode 32, i.e., when electrons are supplied from the lower electrode 32 (when electrons move from the storage layer 42 to the reference layer 44), electrons reflected by the reference layer 44 and spin polarized in the opposite direction to the magnetization direction in the reference layer 44 are injected into the storage layer 42. In this case, the magnetization direction of the storage layer 42 is matched with the opposite direction to the magnetization direction in the reference layer 44. Thereby, the magnetization directions in the reference layer 44 and storage layer 42 are arranged antiparallel to each other. In this antiparallel state, the resistance value of the magnetoresistive element 33 is maximum. This state is defined as, for example, data "1".

Also, data is read from the magnetoresistive element 33 as follows.

A read current is supplied to the magnetoresistive element 33. This read current is set at a value at which the magnetization direction in the storage layer 42 does not reverse (i.e., a value smaller than that of the write current). Data "0" or "1" described above can be read by detecting the change in resistance value of the magnetoresistive element 33 at this occasion.

As shown in FIG. 3, the upper electrode 34 is formed so as to contact the upper surface of the magnetoresistive element 33. The bit line BL is formed on the upper electrode 34 so as to contact thereon. That is, the upper electrode 34 is a bit line contact.

Also, the source line contact 35 is formed on the other diffusion layer 25 (the source side diffusion layer) in the interlayer dielectric layer 31. The source line contact 35 is formed so as to contact the upper surface of the other diffusion layer 25. The source line SL is formed on this source line contact 35 so as to contact thereon. The other diffusion layer 25 and source line contact 35 are shared by two adjacent memory cells.

It is note that of three gate electrodes 23 adjacent to each other in the X direction, two gate electrodes 23 are electrically connected to the magnetoresistive elements 33 and correspond to the word lines WL, and one gate electrode 23 is not electrically connected to the magnetoresistive element 33 and corresponds to the dummy word line DWL.

Configuration Example of Magnetoresistive Element According to Embodiment

A configuration example of the magnetoresistive element 33 according to the present embodiment will be explained with reference to FIGS. 5 and 6.

FIG. 5 is a sectional view showing the configuration example of the magnetoresistive element according to the present embodiment.

As shown in FIG. 5, the lower electrode 32 is formed in an interlayer dielectric layer 31A, and the upper electrode 34 is formed in an interlayer dielectric layer 31C. The magnetoresistive element 33 is formed between the lower electrode 32 and upper electrode 34, and an interlayer dielectric layer 33B is formed between adjacent magnetoresistive elements 33.

The magnetoresistive element 33 according to the present embodiment comprises an underlying layer 41, the storage layer 42, the tunnel barrier layer 43, the reference layer 44, an interlayer 45, and a shift adjusting layer 46.

The underlying layer 41 is formed on the lower electrode 32. The underlying layer 41 contains a conductive nonmagnetic material. Examples of this nonmagnetic material are W, Mo, Ta, Hf, Nb, Al, Ti, and oxides and nitrides of these elements. It is also possible to use an alloy or multilayered film of these elements.

The storage layer 42 is formed on the underlying layer 41. The storage layer 42 contains ferromagnetic materials such as Co and Fe. Also, B is added to the ferromagnetic materials in order to adjust the saturation magnetization or magnetocrystalline anisotropy. That is, the storage layer 42 comprises a compound such as CoFeB. The storage layer 42 has a relatively high Co concentration (Co rich) in order to suppress the oxidation of the storage layer 42 (particularly Fe) in a process of oxidizing redeposit substance (re-adhesion substance), which is described later, onto the sidewall. "Co rich" herein mentioned indicates that the Co ratio is higher than the stoichiometric ratio.

The tunnel barrier layer 43 is formed on the storage layer 42. The tunnel barrier layer 43 contains a nonmagnetic material such as MgO. However, the material is not limited to this, and the tunnel barrier layer 43 may contain a metal oxide such as $Al_2O_3$, MgAlO, ZnO, or TiO.

The reference layer 44 is formed on the tunnel barrier layer 43. The reference layer 44 comprises the first magnetic layer 44A, nonmagnetic layer 44B, and second magnetic layer 44C.

The first magnetic layer 44A is formed on the tunnel barrier layer 43. In other words, in the reference layer 44, the first magnetic layer 44A is formed on the side of the tunnel barrier layer 43. The first magnetic layer 44A contains ferromagnetic materials such as Co and Fe. Also, B is added to the ferromagnetic materials in order to adjust the saturation magnetization or magnetocrystalline anisotropy. That is, like the storage layer 42, the first magnetic layer 44A comprises the compound such as CoFeB. The first magnetic layer 44A is a layer that contributes to the MR ratio. Therefore, the first magnetic layer 44A desirably has a high crystallinity and is lattice matched with the tunnel barrier layer 43.

The nonmagnetic layer 44B is formed above the first magnetic layer 44A and below second magnetic layer 44C. In other words, the nonmagnetic layer 44B is formed between the first magnetic layer 44A and second magnetic layer 44C. The nonmagnetic layer 44B contains a nonmagnetic material. Also, the nonmagnetic layer 44B comprises a nonmagnetic material that does not diffuse into the first magnetic layer 44A even when annealing is performed at a high temperature (600° C. or more) in the manufacturing process. Furthermore, the nonmagnetic layer 44B comprises a nonmagnetic material that suppresses the diffusion of the nonmagnetic material of the second magnetic layer 44C into the first magnetic layer 44A even when annealing is performed at a high temperature (600° C. or more) in the manufacturing process. An example of this nonmagnetic material is TiN. The basis will be described later with reference to FIG. 6.

It is note that the nonmagnetic layer 44B is not limited to TiN, and may comprises of, e.g., TaN, WN, or HfN.

The second magnetic layer 44C is formed on the nonmagnetic layer 44B. In other words, in the reference layer 44, the second magnetic layer 44C is formed on the side opposite to the tunnel barrier layer 43. The second magnetic layer 44C contains a ferromagnetic material and nonmagnetic material. An example of the nonmagnetic material is Pt. Also, an example of the ferromagnetic material is a ferromagnetic material such as Co. That is, the second magnetic layer 44C comprises, for example, a multilayered film of Pt layer and Co layer. This multilayered film comprises alternately stacked Pt layers and Co layers. The second magnetic layer 44C contributes to the perpendicular magnetic anisotropy. It is note that the second magnetic layer 44C may contain Pd, instead of Pt, as the nonmagnetic material.

The shift adjusting layer 46 is formed on the interlayer 45 on the reference layer 44 (the second magnetic layer 44C). The interlayer 45 contains a conductive nonmagnetic material such as Ru. The shift adjusting layer 46 is a magnetic layer having an invariable magnetization direction, and has perpendicular magnetic anisotropy perpendicular or almost perpendicular to the film surfaces. In addition, the magnetization direction is opposite to that in the reference layer 44. Thereby, the shift adjusting layer 46 can cancel a leakage magnetic field from the reference layer 44, which is applied to the storage layer 42. In other words, the shift adjusting layer 46 has an effect of adjusting offset of reversal property for the storage layer 42, caused by the leakage magnetic field from the reference layer 44, in the opposite direction. The shift adjusting layer 46 comprises, for example, an artificial lattice comprising a multilayered structure including a ferromagnetic material such as Ni, Fe, or Co and a nonmagnetic material such as Cu, Pd, or Pt. The upper electrode 34 is formed on this shift adjusting layer 46.

In addition, the planar shape of the underlying layer 41, storage layer 42, tunnel barrier layer 43, reference layer 44, interlayer 45, and shift adjusting layer 46 is, for example, a circle. Therefore, the magnetoresistive element 33 is formed into a pillar shape. However, the planar shape of the magnetoresistive element 33 is not limited to this, and may be a square, rectangle, ellipse, or the like.

In addition, the storage layer 42 and the reference layer 44 may have a dimensional difference in a plane. For example, a diameter of the reference layer 44 may be smaller than a diameter of the storage layer 42 in a plane. And an insulating layer corresponding to the dimensional difference from the storage layer 42 may be formed as a sidewall of the reference layer 44. This makes it possible to prevent an electrical short-circuit between the storage layer 42 and reference layer 44.

Furthermore, the arrangement of the magnetoresistive element 33 may be inverted. That is, the shift adjusting layer 46, interlayer 45, second magnetic layer 44C, nonmagnetic layer 44B, first magnetic layer 44A, tunnel barrier layer 43, storage layer 42, and underlying layer 41 may be formed in this order on the lower electrode 32.

FIG. 6 is a graph showing the relationship between annealing temperature and magnetization in the reference layer. More specifically, FIG. 6 shows magnetization when the annealing is performed to a reference layer in which a Ta layer is stacked as a cap layer on a CoFeB layer (a comparative example), and magnetization when the annealing is performed to a reference layer in which a TiN layer is stacked as a cap layer on the CoFeB layer (the present embodiment).

As shown in FIG. 6, in the comparative example using the Ta layer as a cap layer, magnetization does not reduce even the annealing is performed at 500° C. or less. However, the magnetization reduces when the annealing is performed at 600° C. or more. This is so because when the high temperature annealing at 600° C. or more is performed, Ta atoms as a nonmagnetic material diffuse from the Ta layer into the CoFeB layer. Consequently, the crystallinity of the CoFeB layer is destroyed, and the magnetic characteristic (magnetization) is deteriorated.

By contrast, in the present embodiment using the TiN layer as a cap layer, the magnetization does not reduce even the high temperature annealing at 600° C. or more is performed. This is so because Ti atoms are bonded to N atoms in the TiN layer, so Ti atoms as a nonmagnetic material does not diffuse from the TiN layer into the CoFeB layer even the high temperature annealing at 600° C. (inclusive) to 800° C. (inclusive) is performed. In the present embodiment as described above, the crystallinity of the CoFeB layer can be improved by performing the high temperature annealing without diffusing the nonmagnetic material, and the magnetic characteristic (magnetization) can be improved.

Also, it is known that a transition metal nitride can be used as a diffusion prevention layer for noble metal. In particular, TiN, WN, and the like are used as a diffusion prevention layer for a Cu interconnect in an LSI. Equally in the magnetoresistive element 33 of the present embodiment, by using the transition metal nitride such as TiN as the nonmagnetic layer 44B, TiN functions as a diffusion prevention layer. That is, when using, for example, Pt, Pd, or a rare earth metal for the second magnetic layer 44C, any of these elements can be prevent from be diffusing into the first magnetic layer 44A. The same effect can be obtained by using TaN or HfN instead of TiN.

Method of Manufacturing Magnetoresistive Element According to Embodiment

A method of manufacturing the magnetoresistive element 33 according to the present embodiment will be explained below with reference to FIG. 7 to FIG. 10.

FIG. 7 to FIG. 10 are sectional views showing the manufacturing steps of the magnetoresistive element according to the present embodiment.

Figure 7:
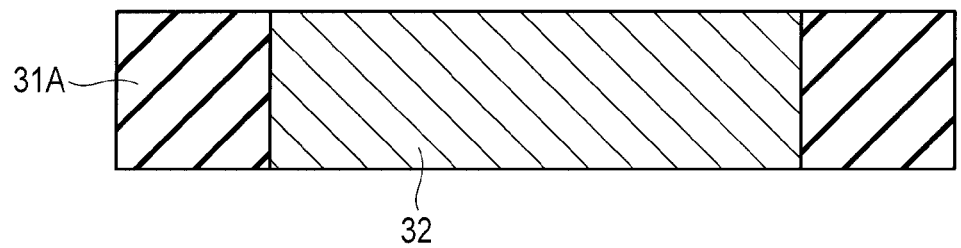

First, as shown in FIG. 7, an interlayer dielectric layer 31A is formed on a semiconductor substrate 21 by, for example, CVD (Chemical Vapor Deposition). Next, a hole not shown reaching the semiconductor substrate 21 is formed in the interlayer dielectric layer 31A by, for example, lithography. Thereafter, a lower electrode 32 is formed in this hole by, for example, CVD. The lower electrode 32 contains, for example, TiN, but the material is not limited to this.

Figure 8:
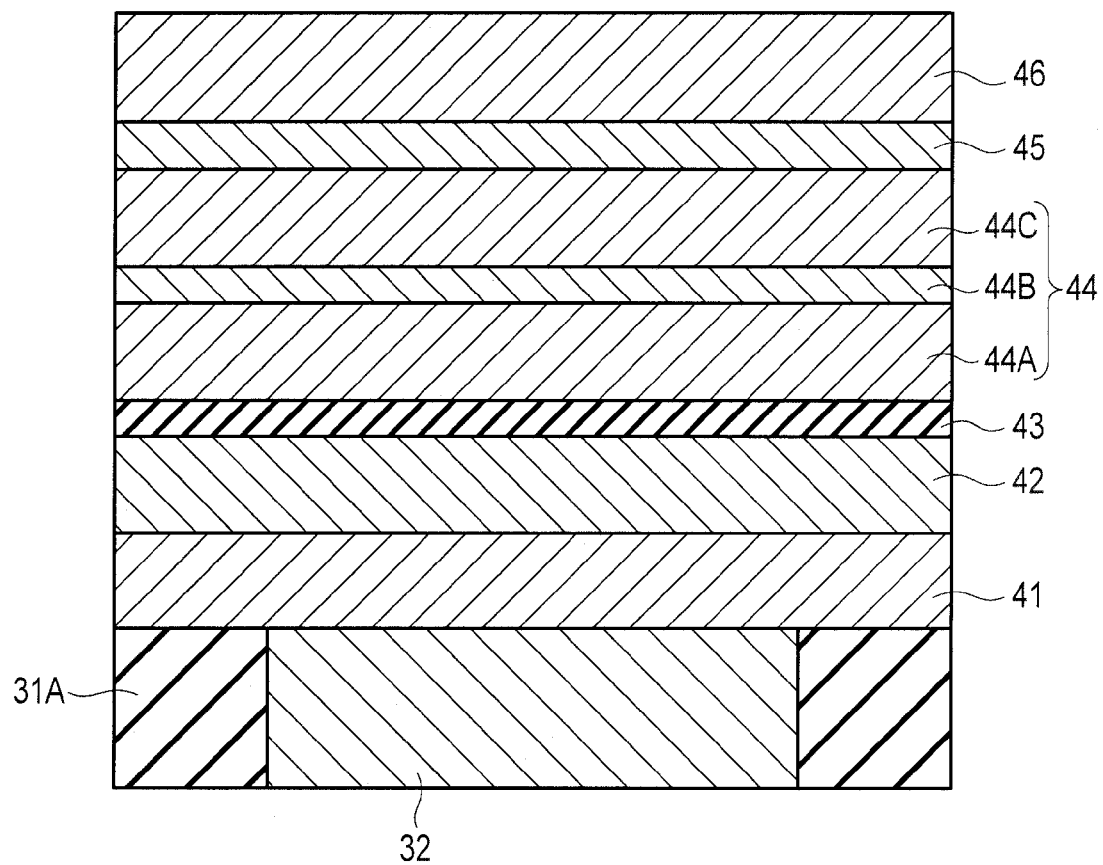

Next, as shown in FIG. 8, an underlying layer 41 is formed on the lower electrode 32 and the interlayer dielectric layer 31A by, for example, sputtering method. The underlying layer 41 contains conductive nonmagnetic material. Examples of such a nonmagnetic material are W, Mo, Ta, Hf, Nb, Al, Ti, and oxides or nitrides of these elements. It is also possible to use an alloy or multilayered film of these elements.

Next, a storage layer 42 is formed on the underlying layer 41 by, for example, sputtering method. The storage layer 42 comprises a compound such as CoFeB or the like. The storage layer 42 has a relatively high Co concentrations (Co rich) in order to suppress the oxidation of the storage layer 42 (particularly Fe) in a process of oxidizing a redeposit substance (re-adhesion substance), which is described later, onto sidewall.

Next, a tunnel barrier layer 43 is formed on the storage layer 42. The tunnel barrier layer 43 contains a nonmagnetic material such as MgO. The MgO layer constituting the tunnel barrier layer 32 may be formed directly by film forming of MgO layer by sputtering method using MgO as a target, or maybe be formed by film forming of MgO layer by sputtering method using Mg as a target and then oxidizing the Mg layer. To increase the MR ratio, it is desirable to directly deposit the MgO layer by sputtering method using MgO as a target.

Next, a first magnetic layer 44A is formed on the tunnel barrier layer 43 by, for example, sputtering method. Like the storage layer 42, the first magnetic layer 44A is comprises the compound such as CoFeB.

Next, a nonmagnetic layer 44B is formed on the first magnetic layer 44A by, for example, sputtering method. The nonmagnetic layer 44B contains nonmagnetic material. Also, the nonmagnetic layer 44B comprises a nonmagnetic material that does not diffuse into the first magnetic layer 44A even the annealing is performed at the high temperature (600° C. or more) in a manufacturing process to be described later. Furthermore, the nonmagnetic layer 44B comprises a nonmagnetic material that suppresses the diffusion of the nonmagnetic material of a second magnetic layer 44C into the first magnetic layer 44A even the annealing is performed at a high temperature (600° C. or more) in the manufacturing process to be described later. An example of this nonmagnetic material is TiN.

Next a second magnetic layer 44C is formed on the nonmagnetic layer 44B by, for example, sputtering method. The second magnetic layer 44C contains a magnetic material and nonmagnetic material. The second magnetic layer 44C comprises, for example, a multilayered film of Pt and Co. This multilayered film comprise alternately stacked Pt layers and Co layers. This second magnetic layer 44C contributes to the perpendicular magnetic anisotropy. It is note that the second magnetic layer 44C may contain Pd, instead of Pt, as the nonmagnetic material. The second magnetic layer 44C like this is formed by changing the target during the sputtering method.

Next, an interlayer 45 including Ru is formed on the second magnetic layer 44C by, for example, sputtering method, and a shift adjusting layer 46 is formed on the interlayer 45. The shift adjusting layer 46 comprises, for example, an artificial lattice including a multilayered structure of a ferromagnetic material such as Ni, Fe, or Co and a nonmagnetic material such as Cu, Pd, or Pt.

Thereafter, each layers of the magnetoresistive element 33 are crystallized by performing annealing at 600° C. (inclusive) to 800° C. (inclusive). Thereby, the first magnetic layer 44A increases its crystallinity, and is lattice matched with the tunnel barrier layer 43. As a consequence, the MR ratio can be increased.

In the present embodiment, the nonmagnetic layer 44B formed on the first magnetic layer 44A contains TiN. This TiN is a material that Ti contained therein as a nonmagnetic material hardly diffuses into the first magnetic layer 44A. Thus even the high temperature annealing at 600° C. or more is performed, Ti as a nonmagnetic material is suppressed from being diffused into the first magnetic layer 44A.

In addition, TiN functions as an diffusion prevention layer. Thus, even the high temperature annealing at 600° C. or more is performed, it is possible to suppress the nonmagnetic material of the second magnetic layer 44C positioned on the nonmagnetic layer 44B from diffusing into the first magnetic layer 44A positioned under the nonmagnetic layer 44B.

It is note that the annealing temperature is not limited to 600° C. (inclusive) to 800° C. (inclusive). The annealing temperature need only be such a high temperature that the first magnetic layer 44A crystallizes, and may be 600° C. or less (e.g., a degree that is not less than 300° C. and not higher than 400° C.) The annealing temperature need only be such a low temperature that the nonmagnetic materials contained in the nonmagnetic layer 44B and second magnetic layer 44C do not diffuse into the first magnetic layer 44A, and may be 800° C. or more.

Next, as shown in FIG. 8, a hard mask not shown is formed on the shift adjusting layer 46, and patterned such that its planar shape becomes a circle. The hard mask comprises a conductive metal material, for example, TiN. However, the material is not limited to this, and the hard mask may comprises a film containing Ti, Ta, or W, or a multilayered film of these elements. Thereby, the hard mask need not be removed later, and can be used as a contact portion for the upper electrode 34.

Next, the shift adjusting layer 46, the interlayer 45, the reference layer 44, the tunnel barrier layer 43, the storage layer 42, and the underlying layer 41 are processed by physical etching such as IBE (Ion Beam Etching) using the hard mask as a mask. Thereby, the shift adjusting layer 46, interlayer 45, reference layer 44, tunnel barrier layer 43, storage layer 42, and underlying layer 41 are patterned to have a circular planar shape, like the hard mask.

At this time, the material constituting the underlying layer 41 or lower electrode 32 is formed as the redeposit substance on the circumferential surface of the tunnel barrier layer 43. This redeposit substance may short-circuit the storage layer 42 and reference layer 44.

Therefore, after the shift adjusting layer 46, interlayer 45, reference layer 44, tunnel barrier layer 43, storage layer 42, and underlying layer 41 are patterned, it is desirable to form an insulator by oxidizing the redeposit substance formed on the side surface of the tunnel barrier layer 43.

Here, the storage layer 42 having perpendicular magnetic anisotropy lower than that of the reference layer 44 contains Co rich CoFeB. Co oxidizes less easily than Fe. That is, in this example, the storage layer 42 comprises Co rich CoFeB, so that the oxidation of the storage layer 42 (particular Fe) in the redeposit oxidizing step is suppressed, and the oxidation suppresses the deterioration of the perpendicular magnetic anisotropy.

Next, an interlayer dielectric layer 31B is formed on the entire surface by, for example, CVD method. Thereby, the interlayer dielectric layer is filled buried between adjacent magnetoresistive elements 33. Thereafter, the interlayer dielectric layer formed on the magnetoresistive element 33 is planarized, and then is etched back. Thereby, the upper surface of the magnetoresistive element 33 is exposed. Thereafter, the interlayer dielectric layer 31C is formed on the magnetoresistive element 33 and the interlayer dielectric layer 31B.

Next, as shown in FIG. 5, a hole not shown reaching the magnetoresistive element 33 is formed in the interlayer dielectric layer 31C by, for example, lithography technology. Thereafter, the upper electrode 34 is formed in this hole by, for example, CVD, and is electrically connected to the magnetoresistive element 33.

In this way, the magnetoresistive element 33 according to the present embodiment is formed.

Effects of Embodiment

According to the above-mentioned embodiment, the reference layer 44 of the magnetoresistive element 33 comprises the first magnetic layer 44A containing CoFeB, the second magnetic layer 44C containing Co and Pt, and the nonmagnetic layer 44B formed between them. The nonmagnetic layer 44B comprises TiN. Since Ti atoms contained in TiN are bonded to N atoms, the Ti atoms hardly diffuse into the first magnetic layer 44A even the high temperature annealing at 600° C. or more is performed. Thereby, it is possible by high temperature annealing to increase the crystallinity of the first magnetic layer 44A while suppressing the diffusion of the nonmagnetic material contained in the nonmagnetic layer 44B into the first magnetic layer 44A. As a consequence, the MR ratio can be increased.

Also, TiN functions as a diffusion prevention layer. Therefore, it is possible by high temperature annealing to suppress the diffusion of the nonmagnetic material (e.g., Pt) contained in the second magnetic layer 44C positioned on the nonmagnetic layer 44B into the first magnetic layer 44A. Therefore, the crystallinity of the first magnetic layer 44A can be further increased, and the MR ratio can be increased.

It is note that the high temperature annealing is performed after all the layers of the magnetoresistive element 33 are formed in the present embodiment, but it is not limited to this. It is also possible to adopt a manufacturing process of performing the high temperature annealing after the first magnetic layer 44A and nonmagnetic layer 44B are formed and before the second magnetic layer 44C is formed. That is, the effect of suppressing the diffusion of the nonmagnetic material contained in the nonmagnetic layer 44B can be obtained by the high temperature annealing, regardless of the presence/absence of the second magnetic layer 44C.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within scope and spirit of the inventions.

What is claimed is:

1. A magnetoresistive element comprising:
   a first magnetic film;
   a second magnetic film; and
   a first nonmagnetic layer formed between the first magnetic film and the second magnetic film,
   wherein the second magnetic film includes a first magnetic layer formed on a side of the first nonmagnetic layer, a second magnetic layer formed on a side opposite to the first nonmagnetic layer, and a second nonmagnetic layer formed between the first magnetic layer and the second magnetic layer, the second nonmagnetic layer containing TiN, and
   wherein the first magnetic layer is lattice matched with the first nonmagnetic layer.

2. The element of claim 1, wherein the first magnetic layer contains Co, Fe, and B.

3. The element of claim 1, wherein the second magnetic layer contains a magnetic material and a nonmagnetic material.

4. The element of claim 1, wherein the second magnetic layer contains Co and Pt.

5. The element of claim 1, wherein the second magnetic layer is configured by alternately stacking a plurality of Pt layers and a plurality of Co layers.

6. The element of claim 1, wherein:
   the first magnetic film is a storage layer which has perpendicular magnetic anisotropy with respect to a film surface, and in which a magnetization direction is variable, and
   the second magnetic film comprises a reference layer which has perpendicular magnetic anisotropy with respect to a film surface, and in which a magnetization direction is invariable.

7. A magnetoresistive element comprising:
   a first magnetic film;
   a second magnetic film; and
   a first nonmagnetic layer formed between the first magnetic film and the second magnetic film,
   wherein the second magnetic film includes a first magnetic layer formed on a side of the first nonmagnetic layer, a second magnetic layer formed on a side opposite to the first nonmagnetic layer, and a second nonmagnetic layer formed between the first magnetic layer and the second magnetic layer, the second nonmagnetic layer containing one of TiN, TaN, and HfN, and
   wherein the first magnetic layer is lattice matched with the first nonmagnetic layer.

8. The element of claim 7, wherein the first magnetic layer contains Co, Fe, and B.

9. The element of claim 7, wherein the second magnetic layer contains a magnetic material and a nonmagnetic material.

10. The element of claim 7, wherein the second magnetic layer contains Co and Pt.

11. The element of claim 7, wherein the second magnetic layer is configured by alternately stacking a plurality of Pt layers and a plurality of Co layers.

12. The element of claim 7, wherein:
   the first magnetic film comprises a storage layer which has perpendicular magnetic anisotropy with respect to a film surface, and in which a magnetization direction is variable, and
   the second magnetic film comprises a reference layer which has perpendicular magnetic anisotropy with respect to a film surface, and in which a magnetization direction is invariable.

* * * * *